(12) United States Patent
Yamazaki

(10) Patent No.: US 7,639,723 B2
(45) Date of Patent: Dec. 29, 2009

(54) TUNABLE LASER, OPTICAL MODULE, AND CONTROL METHOD THEREOF

(75) Inventor: Hiroyuki Yamazaki, Tokyo (JP)

(73) Assignee: NEC Corporation, Tokyo (JP)

( * ) Notice: Subject to any disclaimer, the term of this patent is extended or adjusted under 35 U.S.C. 154(b) by 241 days.

(21) Appl. No.: 11/364,046

(22) Filed: Mar. 1, 2006

(65) Prior Publication Data
US 2006/0198415 A1    Sep. 7, 2006

(30) Foreign Application Priority Data
Mar. 3, 2005    (JP) ............................. 2005-059641

(51) Int. Cl.
*H01S 3/083* (2006.01)

(52) U.S. Cl. .............................. 372/94; 372/20; 372/26; 372/29.01; 372/36; 372/50.21; 372/93; 372/66; 372/68; 372/700

(58) Field of Classification Search ................... 372/20, 372/26, 29.01, 36, 50.21, 66, 68, 93, 700
See application file for complete search history.

(56) References Cited

U.S. PATENT DOCUMENTS

| | | | |
|---|---|---|---|
| 4,852,117 A * | 7/1989 | Po .............................. | 372/97 |
| 6,690,687 B2 * | 2/2004 | Ksendzov et al. ............. | 372/20 |
| 7,242,704 B2 * | 7/2007 | Kaneko ................... | 372/50.21 |
| 2001/0045465 A1 * | 11/2001 | Schmidt et al. ........ | 235/462.45 |
| 2002/0085595 A1 | 7/2002 | Ksendzov et al. | |
| 2004/0004981 A1 * | 1/2004 | Chen et al. .................... | 372/32 |
| 2004/0032886 A1 * | 2/2004 | Taghavi-Larigani et al. ... | 372/20 |

FOREIGN PATENT DOCUMENTS

CN    1459899 A    12/2003

(Continued)

OTHER PUBLICATIONS

Sakano et al "Tunable DFB Laser with a Striped Thin-Film Heater" IEEE Phontonics Technology Letters (1992):321-323.*

(Continued)

*Primary Examiner*—Minh-Loan T Tran
*Assistant Examiner*—Fei Fei Yeung Lopez
(74) *Attorney, Agent, or Firm*—Sughrue Mion, PLLC

(57) ABSTRACT

A tunable laser is provided, including: a multiple ring resonator that is formed by coupling ring resonant elements having different optical path length from each other; an input/output-side waveguide connected to one of the ring resonant elements; a reflection-side wave guide connected to another one of the ring resonant elements; a PLC substrate on which the multiple ring resonator, the input/output side waveguide, and the reflection-side waveguide are formed; a high reflection film provided to the reflection-side waveguide; an SOA connected to the input/output-side waveguide; film heaters and a phase control region of the SOA for changing the resonant wavelength of the multiple ring resonator; and a light-receiving element for detecting the resonant wavelength of the multiple ring resonator in a thru port of a directional coupler.

9 Claims, 16 Drawing Sheets

FOREIGN PATENT DOCUMENTS

| | | |
|---|---|---|
| EP | 1 133 034 A2 | 9/2001 |
| JP | 58-111501 A | 7/1983 |
| JP | 62-100706 A | 5/1987 |
| JP | 63-281104 A | 11/1988 |
| JP | 6-188497 A | 7/1994 |
| JP | 7-22674 A | 1/1995 |
| JP | 2004-279982 A | 10/2004 |
| WO | WO 2004/034528 A2 | 4/2004 |
| WO | WO 2005/096462 A1 | 10/2005 |

OTHER PUBLICATIONS

Kohroh Kobayashi, "Optical Integrated Devices," the second impression of the first edition, published by Kyoritsu Shuppan Co., Ltd., Dec. 2000, pp. 104-122.

Yamazaki, et al., "Widely Tunable Laser Consisting of a Silica Waveguide Double Ring Resonator Connected Directly to a Semiconductor Optical Amplifier", Proceedings of the European Conference on Optical Communication, Sep. 9, 2004, pp. 22-23, vol. 6, XP009066926.

* cited by examiner

TUNABLE LASER, OPTICAL MODULE, AND CONTROL METHOD THEREOF

BACKGROUND OF THE INVENTION

1. Field of the Invention

The present invention relates to a tunable laser and the like having a wavelength monitor for detecting wavelengths, which can be used in a WDM (Wavelength Division Multiplexing) transmission system and the like, for example.

2. Description of the Related Art

Going into an era of broadband, there have been increasing adoptions of WDM transmission systems that are capable of achieving communication with a plurality of light wavelengths by a single system for enabling effective utilization of optical fibers. Recently, there has been spread use of a DWDM device (Dense Wavelength Division Multiplexing device) which multiplexes several tens of light wavelengths and enables transmission at still higher speed. In accordance with this, each WDM transmission system requires light sources corresponding to each light wavelength, and the required number has been increased dramatically in accordance with high multiplexing. Furthermore, ROADM (Reconfigurable optical add/drop multiplexers) which adds/drops an arbitrary wavelength at each node have lately been investigated for commercial use. With adoption of the ROADM system, in addition to expanding the transmission capacity by multiplexing the wavelengths, it is possible to switch optical paths by changing the wavelengths. Therefore, flexibility of the optical network can be dramatically improved.

As the light source of the WDM transmission system, DFB-LD (Distributed feedback laser diode) which oscillates at uniaxial mode has been used widely so far due to its user-friendliness and high reliability. The DFB-LD has diffraction gratings of about 30 nm depth formed over the entire region of a resonator, so that stable uniaxial mode oscillation can be achieved with a wavelength corresponding to the product of the diffraction grating period and twice the equivalent refractive index. However, tuning of the resonant wavelength over a wide range cannot be achieved in the DFB-LD, so that the WDM system is constituted using products which differ only in terms of the wavelengths for each ITU (international telecommunication union) grid. Since it is necessary to use different products for each wavelength, management cost is increased and surplus stock is required in case of breakdown. Furthermore, when a normal DFB-LD is used in the ROADM system which switches the optical paths by the wavelengths, the tunable width of the wavelength range is limited to about 3 nm, which can be changed due to temperature variation. Therefore, it becomes difficult to achieve the structure of the optical network utilizing the characteristic of the ROADM that actively uses the wavelength resources.

In order to overcome the issues of current DFB-LD and achieve uniaxial mode oscillation in a wide range of wavelengths, there have been actively carried out researches of tunable lasers. Hereinafter, some of the conventional tunable lasers among those described in detail in the following Non-patent Literature 1 will be presented as an example for describing a conventional tunable laser.

The tunable lasers are classified into two types, i.e. a type where a tuning mechanism is provided within a laser element, and a type where a tuning mechanism is provided outside the laser element.

As the former type, DBR-LD (Distributed Bragg Reflector Laser Diode) has been proposed, in which an active region for generating gain and a DBR region for generating reflection by the diffraction grating are formed within a same laser element. The tunable range of the wavelengths of the DBR-LD is about 10 nm at the maximum. Further, there has been proposed a DBR-LD using non-uniform diffraction grating, in which an active region for generating the gain and DBR regions sandwiching the active region from the front and rear are formed within a same laser element. In the DBR regions in the front and rear, a large number of reflection peaks are generated by the non-uniform diffraction grating, and the intervals between the reflection peaks are slightly shifted in the front and rear. Due to this structure, so-called "Vernier effect" can be achieved so that it is possible to perform an extremely wide range of tuning. The DBR-LD using the non-uniform diffraction grating achieves tuning action over 100 nm and quasi-continuous tuning action of 40 nm.

In the meantime, for the latter type, there has been proposed a tunable laser where a diffraction grating provided outside the laser element is rotated for returning the light of a specific wavelength to the laser element. Further, a mechanism for successively monitoring the oscillation wavelength is required for this type of tunable laser. Conventionally, a wave-selective component such as etalon is introduced into the module for monitoring the oscillation wavelength.

[Non-patent Literature 1] "Optical Integrated Device" by Kohroh Kobayashi, $2^{nd}$ Impression of $1^{st}$ Edition, KYORITSU SHUPPAN CO., LTD, December 2000, pp. 104-122

Even though there have been a great number of structures proposed as the conventional tunable lasers, there have been facing difficult situation for putting those into practical use because of their shortcomings, e.g. generation of mode hopping, complicated wavelength control method, weak oscillation-resistability, high price due to an increase in the number of elements.

In the DBR-LD, carrier injection is performed to the DBR region for changing the refractive index in that part so as to achieve tuning action. Thus, if crystal defects increase due to the injection of the electric current, the proportion of changes in the refractive index for the current injection fluctuates strikingly. Therefore, it is difficult to maintain the laser oscillation with a constant wavelength over a long period. Furthermore, with the current process technique of a compound semiconductor, inch-up of two inches or more is impossible. Thus, it is difficult to decrease the prices to be lower than the current price with the laser element that is complicated and increased in size.

In the laser element where the tuning mechanism is provided outside, mode jump is easily generated by the oscillation. Thus, it requires a large-scaled oscillation-resistant mechanism, which results in large-scaled module size and increased price. Further, a great number of optical components such as light-receiving elements are required in addition to etalon, for example, for monitoring the oscillation wavelength, thereby increasing the assembling cost. Furthermore, with a conventional method that couples the laser emission face and the etalon spatially using a lens, the wavelength reliability fluctuates due to a slight position shift of etalon. Thus, there is required a highly accurate mounting technique for etalon, which causes an increase in the assembling const.

SUMMARY OF THE INVENTION

The object of the present invention therefore is to overcome the shortcomings of the conventional tunable laser, which have been obstacles for putting it into practical use, and to provide a highly reliable, high-performance, and low-price tunable laser that can be achieved by a simpler structure than that of a wavelength monitor.

The tunable resonator according to the present invention comprises: a multiple resonator in which a plurality of resonant elements having different optical path length from each other are combined; a light reflecting device for returning, to the multiple resonator, a light emitted from the multiple resonator; a tunable device for changing a resonant wavelength of the multiple resonator; a photo detecting device for detecting the light in a thru port of the resonant element included in the multiple resonator; and a control device for controlling the tunable device in accordance with the light detected by the photo detecting device. The tunable laser according to the present invention comprises: the tunable resonator according to the present invention; and a light input/output device which supplies light to the tunable resonator and emits the light returned from the tunable resonator towards the outside.

More specifically, the tunable laser according to the present invention comprises: a multiple ring resonator in which a plurality of ring resonant elements with ring waveguides having different optical path length from each other are coupled through an optical coupling device that includes a directional coupler; an input/output-side waveguide whose one end is connected to one of the plurality of the resonant elements through the optical coupling device; a reflection-side waveguide whose one end is connected to another one of the plurality of the resonant elements through the optical coupling device; a substrate on which the multiple ring resonator, the input/output-side waveguide, and the reflection-side waveguide are formed; a light reflecting device provided at the other end of the reflection-side waveguide; a light input/output device whose light input/output end is connected to the other end of the input/output-side waveguide; a tunable device for changing the resonant wavelength of the multiple ring resonator; and a wavelength detecting device for detecting the resonant wavelength of the multiple ring resonator in the thru port of any one of the ring resonant elements.

The light emitted from the light input/output device is returned through the path in order from the light input/output end, the input/output-side waveguide, the optical coupling device, the multiple ring resonator, the optical coupling device, the reflection-side waveguide, the light reflecting device, the reflection-side waveguide, the optical coupling device, the multiple ring resonator, the optical coupling device, the input/output-side waveguide, and to the light input/output end. The return light becomes the strongest with the resonant wavelength of the multiple ring resonator. The reason is as follows. The FSRs (free spectral ranges) of each of the ring resonant elements constituting the multiple ring resonator are slightly different from each other. Thus, still larger reflection occurs with the wavelength (resonant wavelength) where the periodic changes of reflection (transmission) generated in each of the ring resonant elements come matched. Further, the light passing through the thru port of the ring resonant element becomes the smallest with the resonant wavelength of the multiple ring resonator. Therefore, the resonant wavelength of the multiple ring resonator can be detected through detecting the light quantity in the thru port of the optical coupling device.

The wavelength of the matched cycles changes largely depending on the circumference lengths of the respective ring resonant elements and the waveguide refractive indexes, so that efficient tunable action can be achieved. The waveguide refractive indexes can be changed by the thermooptic effect. The thermooptic effect is a phenomenon where the refractive index of a material increases by heat. In general, any materials have this effect. That is, it is possible to change the resonant wavelength of the multiple ring resonator by utilizing the temperature properties of the plurality of ring resonant elements. The tunable device may be of any types which may heat or cool the ring resonant element. As described, in the present invention, the multiple ring resonator is constituted by connecting, in series, a plurality of ring resonant elements with slightly different circumferences so as to utilize the Vernier effect generated thereby in an effective way.

The substrate is a PLC substrate, for example. The tunable device is for changing the resonant wavelength of the multiple ring resonator by utilizing the temperature properties of the plurality of ring resonant elements, for example. Specifically, a film heater provided on the substrate may be used. The film heater can be easily obtained by forming a metal film, for example, on the substrate, so that it is easy to manufacture. The light input/output device may be a semiconductor optical amplifier (referred to as SOA hereinafter), an optical fiber amplifier, or a semiconductor laser, for example. The wavelength detecting device is a light-receiving element such as a photodiode, a phototransistor, etc. Further, there may be additionally provided a control device for controlling the tunable device such that the resonant wavelength detected by the wavelength detecting device becomes constant. That is, feedback control may be executed for providing the constant resonant wavelength.

The tunable laser according to the present invention will be described more specifically. That is, it may be in a structure where: the plurality of the ring resonant elements are the first to third ring resonant elements; the light reflecting device is the reflection film; the light input/output device is the SOA; the tunable device is the film heater or the phase control region of the SOA; the wavelength detecting device is the light-receiving element; and there is additionally provided a control device for controlling the amount of current flown to the film heater or the phase control region such that the received light amount detected in the light-receiving element becomes the minimum. In this case, a thermoregulation device may further be provided for keeping the substrate at a constant temperature so that the FSR of the first ring resonant element matches the ITU grid. Further, each light-receiving element may detect the light guided from a plurality of thru ports. In that case, the detection sensitivity can be improved.

As described above, the present invention is a wavelength control technique by a new and simple method for the tunable laser using the ring resonant elements, which uses the output light of the thru ports of the ring resonant elements. The present invention does not require an optical component such as etalon, and assembling of the components is easy. Therefore, it is possible to provide the functions that are necessary for a transmission system without increasing the module cost.

The present invention allows a large tunable amount with a small amount of operation even though it is in a simple structure where the resonant wavelength is detected from the thru port of the multiple ring resonator, and the resonant wavelength of the multiple ring resonator is changed based on the result. Therefore, it is possible with the present invention to provide a low-price, high-performance, and highly reliable tunable laser, which has not been achieved conventionally. That is, it is possible to obtain the laser light with an extremely wide range of wavelengths through providing the light input/output device on the substrate where the multiple ring resonator is formed for changing the resonant wavelength of the multiple ring resonator. Furthermore, since there is no current injection to the semiconductor laser and no mechanically movable members employed, it is highly reliable. Moreover, it is a structure where the light input/output device is simply mounted on the substrate so that manufacture thereof is easy and the cost is low.

Use of the laser structure according to the present invention allows the tuning action with a wide wavelength range that cannot be achieved by a regular DFB-LD, with a simple structure using no external mirror that has been used conventionally. Furthermore, unlike the regular external-mirror type tunable laser, there is no movable part being employed. Thus, not only the high reliability but also high oscillation-shock resistability can be achieved. In addition, the wavelength tuning is performed by controlling the electric power supplied to the film heater, for example, so that the changes of the properties over the years become extremely smaller compared to the method that injects the electric current to the semiconductor waveguide. As described above, the tunable laser according to the present invention is superior to the conventional tunable laser in many respects and, further, it can be manufactured at low cost. Therefore, it is an extremely effective structure to be put into practical use.

BRIEF DESCRIPTION OF THE DRAWINGS

FIG. 15 shows a first embodiment of the optical module according to the present invention, in which FIG. 16 shows a second embodiment of the optical module according to the present invention, in which

DETAILED DESCRIPTION OF THE PREFERRED EMBODIMENT

Embodiments of the present invention will be described by referring to the accompanying drawings.

First Embodiment

Figure 1:
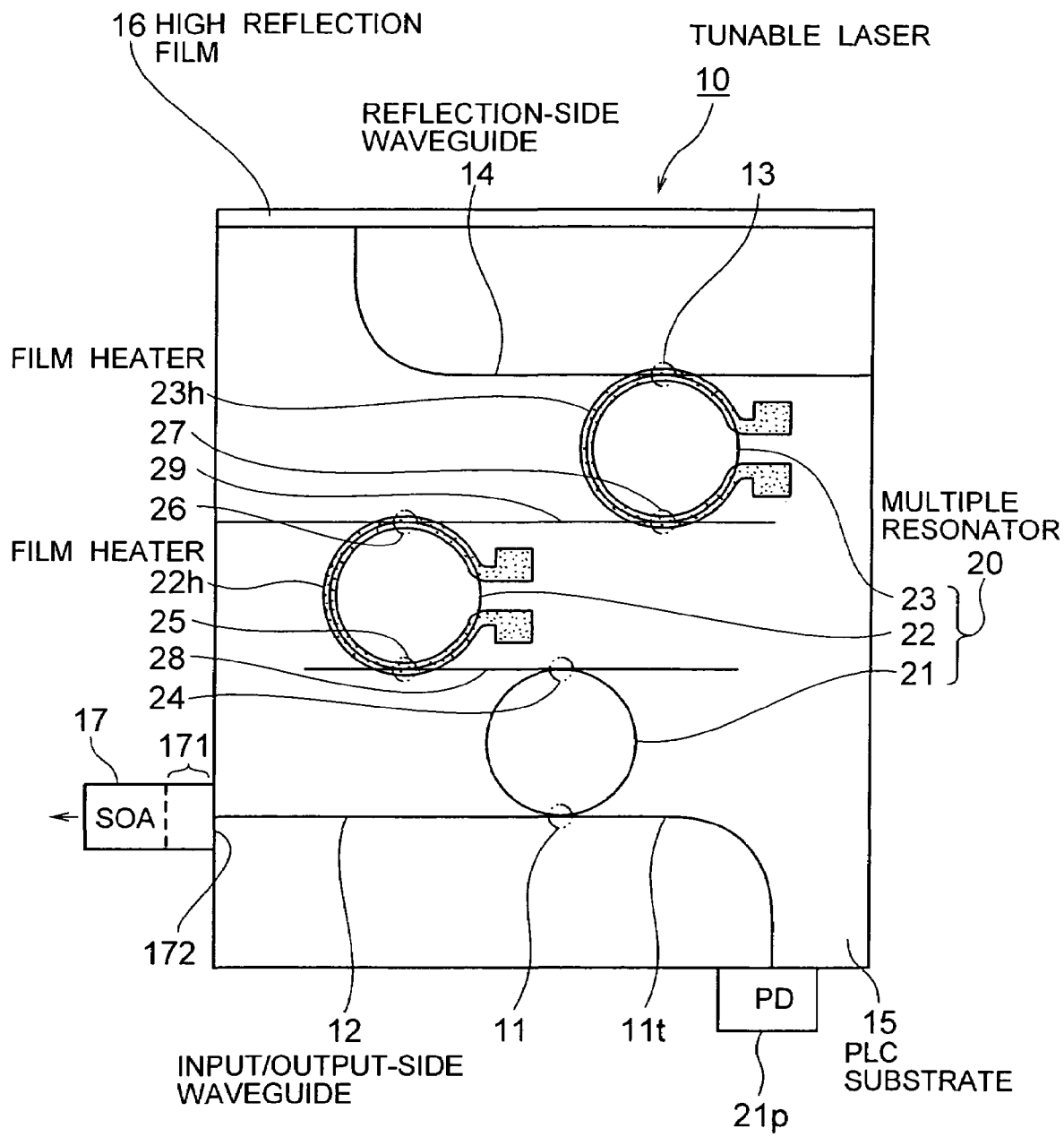
FIG. 1 is a plan view for showing a first embodiment of the tunable laser according to the present invention.

As shown in FIG. 1, a tunable laser 10 of the embodiment comprises: a multiple ring resonator 20; an input/output-side waveguide 12; a reflection-side waveguide 14; a high reflection film 16; a light input/output device 17; film heaters 22h, 23h; and a light-receiving element 21p.

A multiple ring resonator 20 is constituted by combining three ring resonant elements 21, 22, 23. The ring resonant elements 21, 22, 23 comprise ring waveguides formed on a PLC substrate 15, and the ring waveguides of the ring resonant elements 21, 22, 23 are set to have different optical path lengths from each other. Further, the ring waveguides of the ring resonant element 21 and the ring resonant element 22 are coupled by a waveguide 28 and directional couplers 24, 25, while the ring waveguides of the ring resonant element 22 and the ring resonant element 23 are coupled by a waveguide 29 and directional couplers 26, 27.

The reflection-side waveguide 14 is coupled to the ring waveguide of the ring resonant element 23 through a directional coupler 13, and end terminal of the reflection-side waveguide 14 is coupled to the high reflection film 16. The high reflection film 16 is constituted to reflect an optical signal that is outputted from the ring waveguide of the ring resonant element 23 and transmitted through the reflection-side waveguide 14, and return the reflected optical signal to the ring waveguide of the ring resonant element 23 through the reflection-side waveguide 14.

The input/output-side waveguide 12 is coupled to the ring waveguide of the ring resonant element 21 through a directional coupler 11. Further, the light-receiving element 21p is coupled to the end terminal of the input/output-side waveguide 12. At an area of a thru port 11t of the directional coupler 11, the light-receiving element 21p detects the resonant wavelength of a plurality of the ring resonant elements 21, 22, 23 within the multiple ring resonator 20.

The embodiment of the present invention uses a semiconductor optical amplifier (SOA) as the light input/output device 17. The SOA 17 has a phase control region 171, and a light input/output end 72 thereof is coupled to the input/output side of the input/output-side waveguide 12.

The ring resonant elements 21-23 are formed on the PLC substrate 15 by using the PLC (Planar Light wave Circuit) technique, for example. Each kind of the waveguides such as the ring waveguide is formed as a structure such as a quartz glass waveguide that is obtained by depositing quarts glass on a silicon substrate or a glass substrate, a ferroelectric waveguide that is obtained by making a thin film of a ferroelectric material (e.g. lithium niobate), etc.

The film heaters 22h and 23h supply heat strictly to the specific ring resonant elements 22 and 23 of the multiple ring resonator 20. The multiple ring resonator 20 has a structure that resonates with a wavelength where frequencies of the ring resonant elements 21, 22, 23 with shifted cycles intersect. Further, the multiple ring resonator 20 is in such a structure that the resonant wavelength changes when the optical path lengths are modified through changing the circumference length of the ring waveguides of the ring resonant elements 22, 23 and the refractive indexes of the waveguides.

For tuning the resonant wavelength of the multiple ring resonator 20, the embodiment of the present invention provides the film heaters 22h and 23h on the PLC substrate 15 by surrounding the ring waveguides of the ring resonant elements 22 and 23. The circumference length of the ring waveguides of the ring resonant elements 22, 23 and the refractive indexes of the waveguides are changed by supplying the heat of the film heaters 22h, 23h to the ring resonant elements 22, 23. The ring resonant element 21 is blocked from the heat so that it is not affected by the heat of the film heaters 22h and 23h.

The film heaters 22h, 23h of the embodiment are shaped in an arc form that is patterned in the shapes of the ring waveguides of the ring resonant elements 22, 23, and both ends of the arc are electrodes for letting through the electricity. The film heaters 22h, 23h are formed on the PLC substrate 15 by vapor deposition or bonding of a metal film, for example. Aluminum, platinum, chrome and the like are used as the material thereof.

The SOA 17 having the phase control region 171 is of wide use, so that description of the structure and the operating principle thereof will be omitted.

In the embodiment, a photodiode is used as the light-receiving element 21p. Further, the PLC substrate 15 is provided on a Peltier element (see FIG. 15 and FIG. 16) as a thermoregulation device. The Peltier element maintains the constant temperature of the PLC substrate 15 so that the FSR of the ring resonant element 21 matches the ITU grid. The SOA 17 is coupled to the other end of the input/output-side waveguide 12 through a non-reflection film (not shown). The high reflection film 16 is formed by vapor-depositing or pasting a ferroelectric multilayer film on the side face of the PLC substrate 15, for example.

Figure 2:
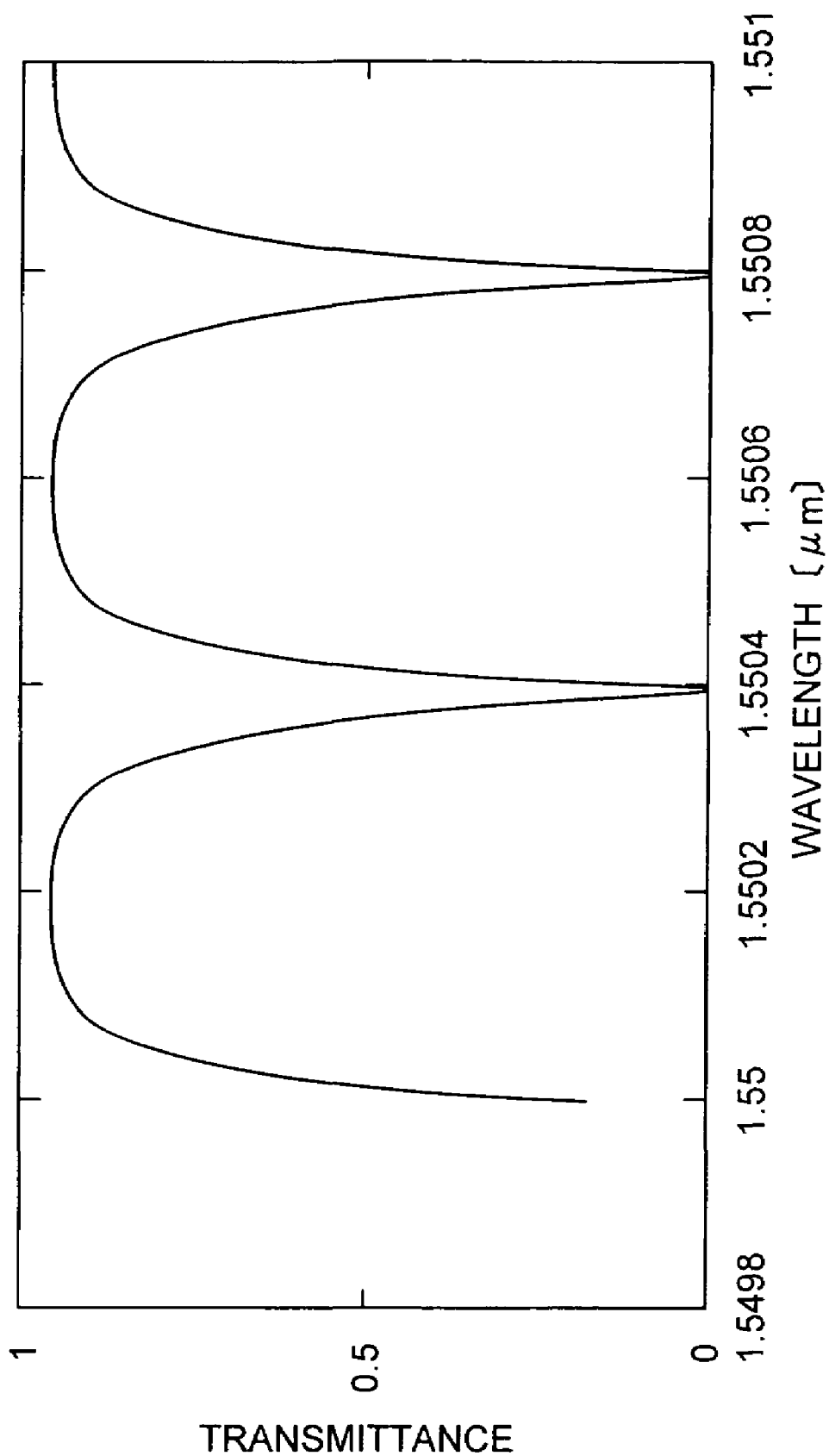
FIG. 2 is a graph for showing the wavelength dependency of the transmittance of a thru port in the tunable laser of FIG. 1.
Figure 3:
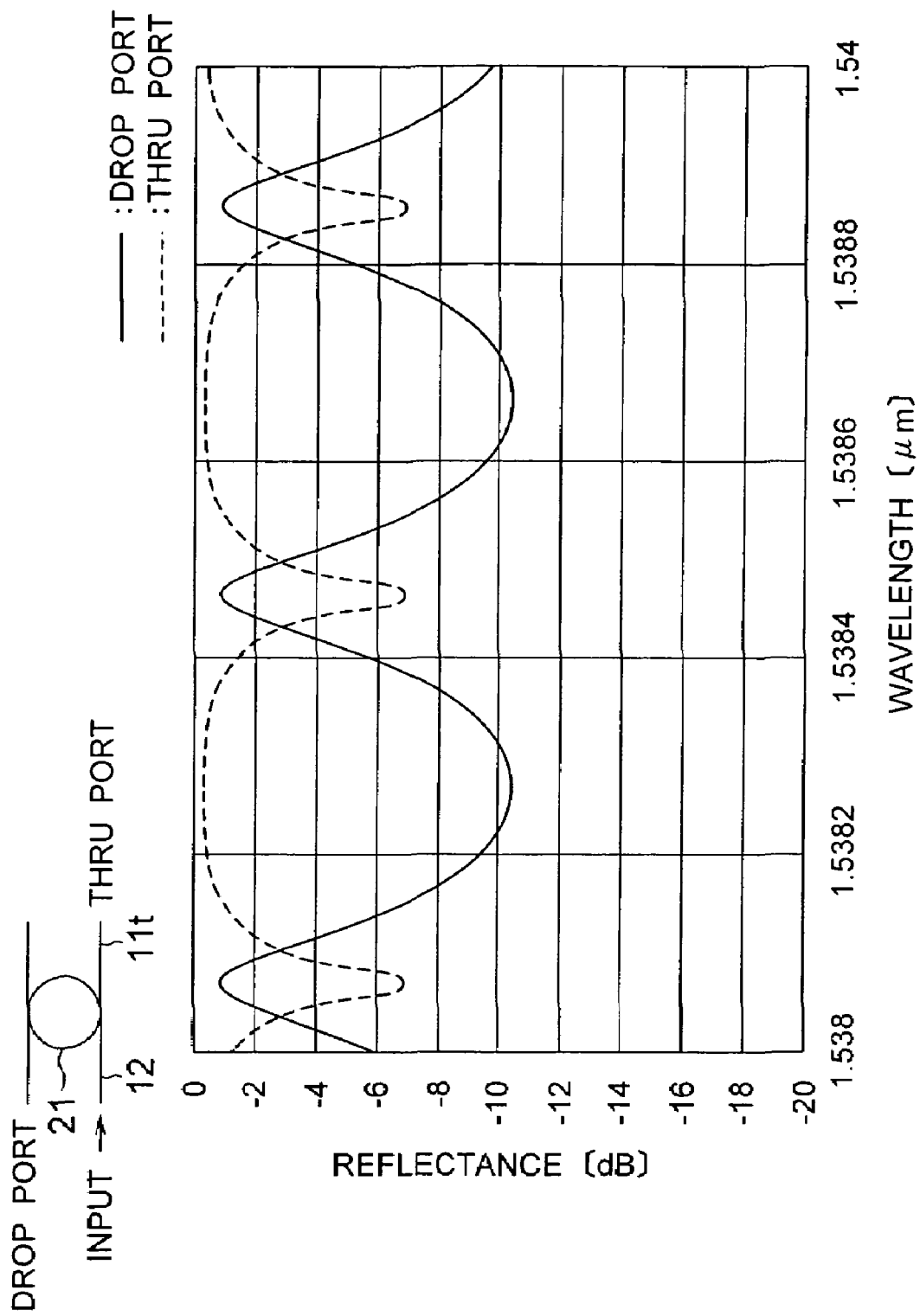
FIG. 3 is a graph for showing the wavelength dependencies of the reflectance of a thru port and that of the drop port in the tunable laser of FIG. 1.
Figure 4:
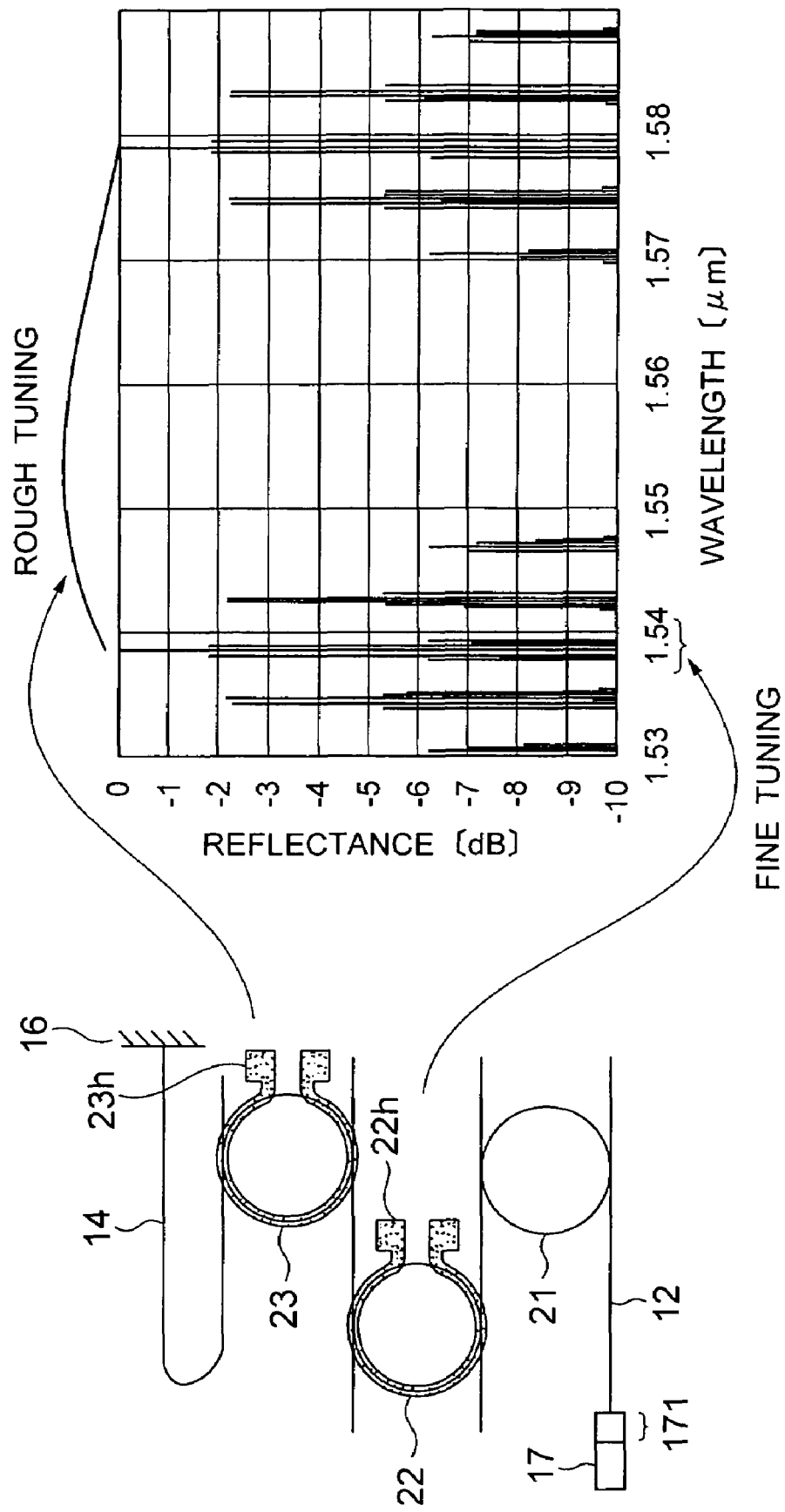
FIG. 4 is an illustration for describing the operating principle of the tunable laser of FIG. 1.

FIG. 2 is a graph for showing the wavelength dependency of the transmittance of the thru port according to the embodiment. FIG. 3 is a graph for showing the wavelength dependencies of the reflectance of the thru port and that of the drop port according to the embodiment. FIG. 4 is an illustration for describing the operating principle of the tunable laser according to the embodiment. Action of the tunable laser 10 will be described hereinafter by referring to FIG. 1-FIG. 4.

The light emitted from the SOA 17 reaches the high reflection film 16 in order from the SOA 17, the input/output-side waveguide 12, the directional coupler 11, the multiple ring resonator 20, the directional coupler 13, the reflection-side waveguide 14, and to the high reflection film 16. It is reflected by the high reflection film 16 and returned to the SOA 17 through the path in order from the reflection-side waveguide 14, the directional coupler 13, the multiple ring resonator 20, the directional coupler 11, the input/output-side waveguide 12, and to the SOA 17. The return light becomes the strongest with the resonant wavelength of the multiple ring resonator 20. The reason is as follows. The FSRs of each of the ring resonant elements 21-23 constituting the multiple ring resonator 20 are slightly different from each other. Thus, still larger reflection occurs with the wavelength (resonant wavelength) where the periodic changes of reflection (transmission) generated in each of the ring resonant elements 21-23 come matched. Further, the light passing through the thru port 11t of the directional coupler 11 becomes the smallest with the resonant wavelength of the multiple ring resonator 20 (FIG. 2 and FIG. 3). Therefore, the resonant wavelength of the multiple ring resonator 20 can be detected through detecting the light quantity in the thru port 11t by the light-receiving element 21p.

The transmission characteristic of the thru port shown in FIG. 2 was calculated from the following expression.

$$t = \frac{1 - \exp\left(j \times \frac{2\pi}{r} \times ni \times LL\right)}{1 - low^2 \times \exp\left(j \times \frac{2\pi}{r} \times ni \times LL\right)}$$ [Expression 1]

where, r is the wavelength, ni is the waveguide refractive index, LL is the ring resonator circumference, low is the branching ratio of the directional coupler, respectively. As can be seen from FIG. 2, the thru port of the ring resonator exhibits a periodic and strong wavelength dependency.

In the meantime, the resonant wavelength, i.e. the wavelength of the matched cycles, changes largely depending on variations in the circumference lengths of the respective ring resonant elements 21-23 and the waveguide refractive indexes. The waveguide refractive indexes can be changed by the thermooptic effect. That is, the resonant wavelength of the multiple ring resonator 20 can be changed by controlling the amount of electric current flown to the filmy heaters 22h, 23h using the temperature properties of the ring resonant elements 22, 23. In that state, the wavelength of the light emitted from the SOA 17 is also changed by controlling the amount of the current flown to the phase control region 171. As described above, in the embodiment, the multiple ring resonator 20 is constituted by connecting, in series, three ring resonant elements 21-23 with slightly different circumferences so as to utilize the Vernier effect generated thereby in an effective way.

FIG. 4 shows the relation between the wavelength and the reflectance when the circumference lengths of the ring resonant elements 21-23 are set as 4000 μm, 4400 μm, and 4040 μm, respectively. At this time, the film heater 22h operates as a tunable device for fine tuning, and the film heater 23h operates as a tunable device for rough tuning. Further, wavelength control of about several 10 nm is executed by supplying an electric current to the phase control region 171 of the SOA 17.

Figure 5:
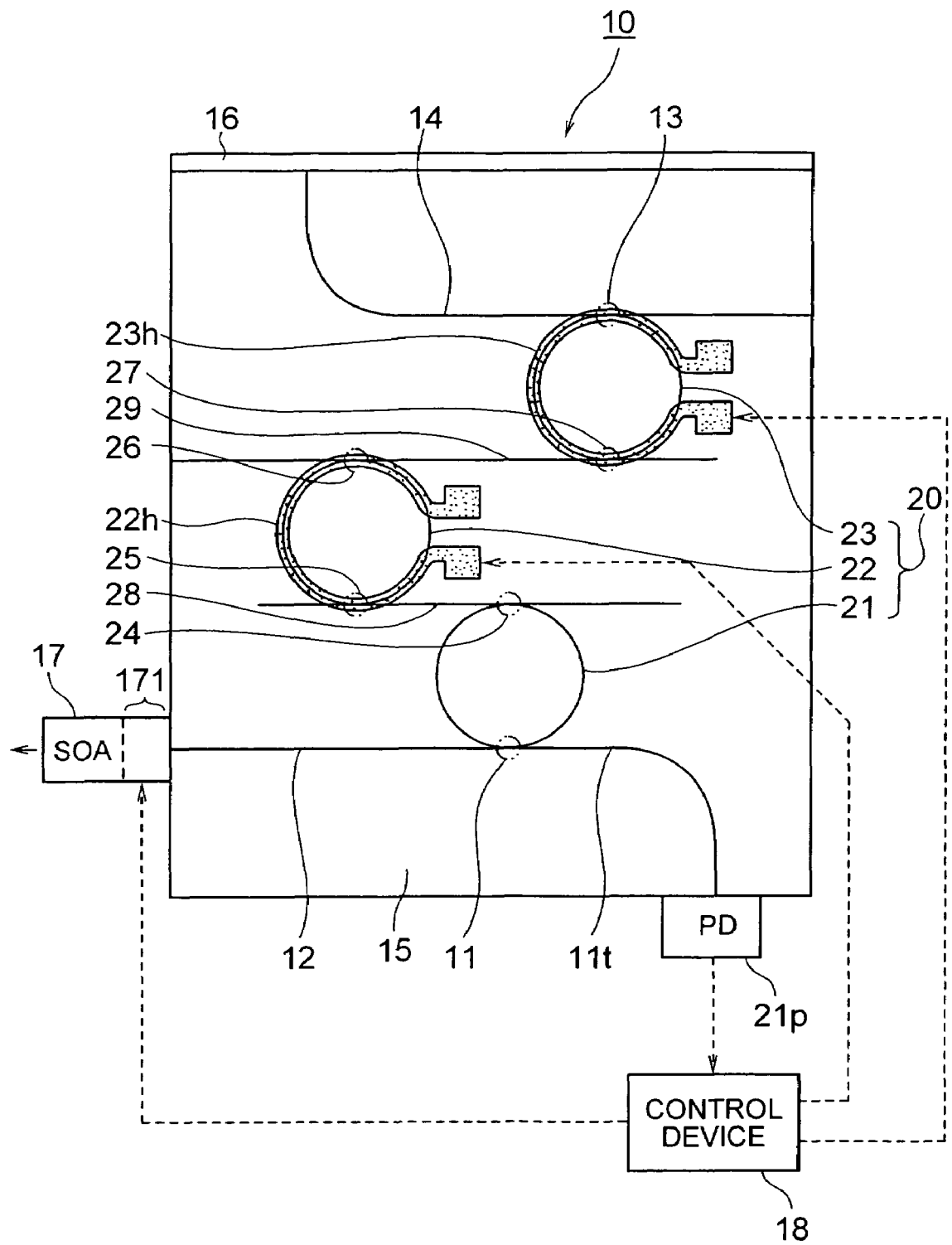
FIG. 5 is a block diagram for showing the case where a control device is added to the tunable laser of FIG. 1.
Figure 6:
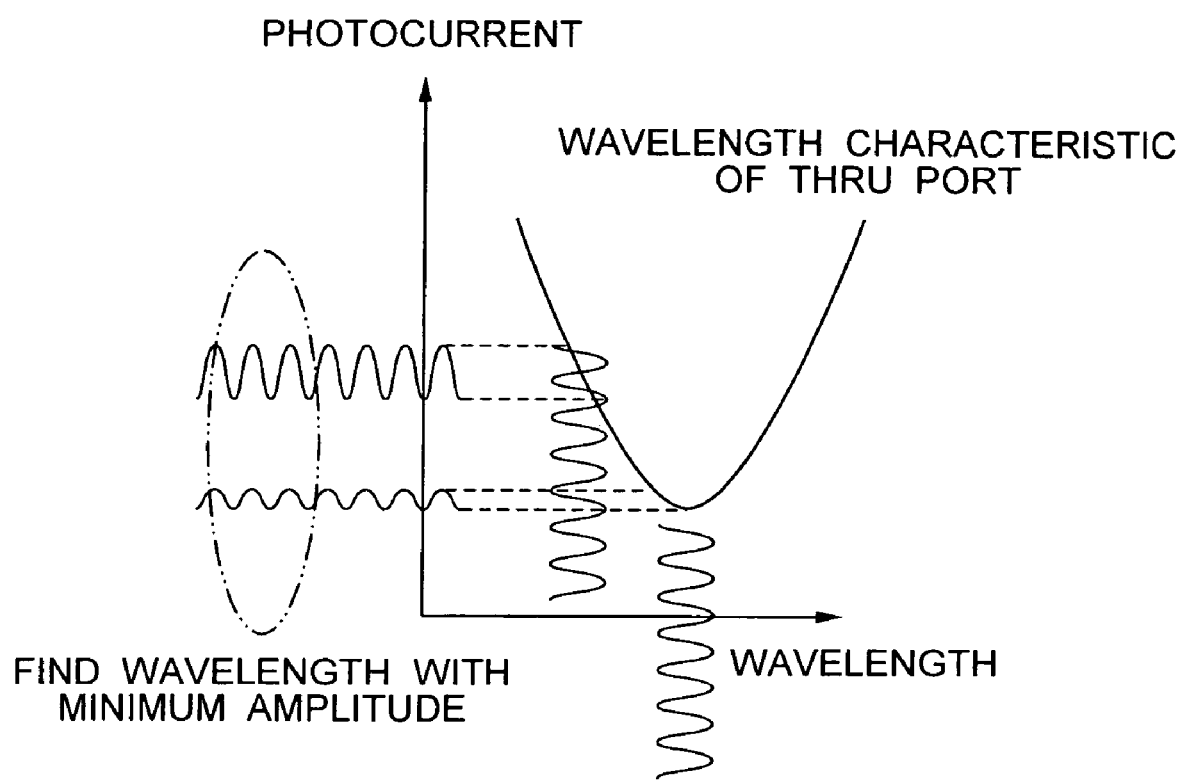
FIG. 6 is a graph for showing an example of action of the control device of FIG. 5.

FIG. 5 is a block diagram of the case where a control device is added to the tunable laser of FIG. 1. FIG. 6 is a graph for showing an example of the action of the control device shown in FIG. 5. Description will be provided hereinafter by referring to those drawings. However, in FIG. 5, the same reference numerals are applied to the same components as those of FIG. 1, and the description thereof is omitted.

The tunable laser 10 is provided with the control device 18. The control device 18 is constituted mainly with a microprocessor such as DSP and a program thereof, which controls the amount of current flown to the film heaters 22h, 23h and the phase control region 171 such that the light-receiving amount detected by the light-receiving element 21p becomes the minimum (i.e. the resonant wavelength becomes constant). For example, the control device 18 changes the wavelength into a sine waveform through restricting the current amount flown to the film heaters 22h, 23h and the phase control region 171, and finds the wavelength where amplitude of the photocurrent obtained in the light-receiving element 21p in that state becomes minimum. As can be seen from FIG. 6 and FIG. 2, such wavelength is the desired resonant wavelength.

Next, the tunable laser 10 of the embodiment will be described collectively by referring to FIG. 1-FIG. 6.

The tunable laser 10 is structured to perform uniaxial-mode oscillation by selecting the resonant mode through utilizing the wavelength transmitting characteristic of the drop ports of the ring resonant elements 21-23. The circumference lengths of the ring waveguides provided to the three-step ring resonant elements 21-23 that constitutes the multiple ring resonator 20 are set to be slightly different from each other. Thereby, the resonant wavelength of the three ring resonant elements 21-23 is tuned within a wide tuning range of several 10 nm. However, resonance generated when the frequencies of the ring resonant elements 21-23 with shifted cycles intersect occurs only at one point within the tunable wavelength range, so that the uniaxial-mode oscillation occurs with that wavelength.

The tuning action is performed mainly by supplying current to the film heaters 22h, 23h formed on the ring resonant elements 22, 23. In the meantime, the output light of the thru port 11t of the ring resonant element 21 with no film heater being formed is taken out and converted to an electric current value by the light-receiving element 21p for detecting a wavelength error component. The output light can be taken out not only from the drop port of the ring resonant elements 21-23 but also from the thru port having a wavelength blocking characteristic. In the embodiment, wavelength detecting action is carried out by using the output light from the thru port. The wavelength transmitting characteristic of the thru port is shown in FIG. 2.

As described above, the embodiment is distinctive mainly because it is provided with the light-receiving element 21p for detecting the light from the thru port 11t, and the FSR of the ring resonant element 21 that demultiplexes the detected light matches the ITU grid. Due to the latter, the oscillation wavelength can be obtained by the uniaxial-mode oscillation with dispersed wavelength matching the ITU grid. However, the dissociation amount from the ITU grid is unknown. In order to avoid this, in the embodiment, the circumference lengths of the ring waveguides of the ring resonant elements 22, 23 that perform tuning action and the refractive indexes of the waveguides, or the phase of the SOA 17 are controlled such that the output light from the thru port 11t of the ring resonant element 21 becomes the minimum. Specifically, as described above, the wavelength control is carried out precisely by using a method, for example, which selects the wavelength where the amplitude of the photocurrent obtained by the light-receiving element 21p becomes the minimum by slightly changing the resonant wavelength of the ring resonant elements 21, 22, 23 through varying the circumference lengths of the ring waveguides of the ring resonant elements 22, 23 and the refractive indexes of the waveguides by using the film heaters 22h, 23h.

Second Embodiment

Figure 7:
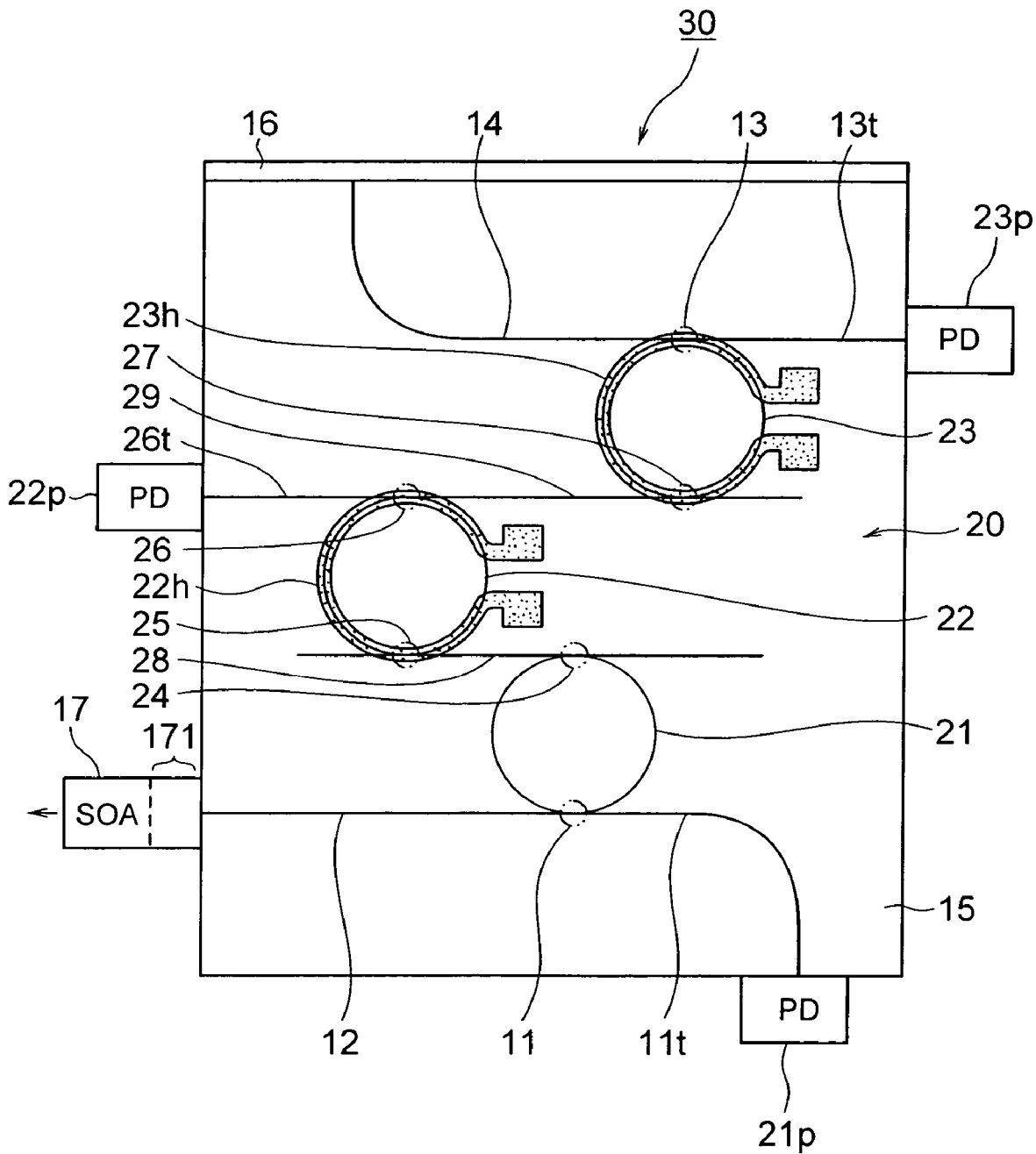
FIG. 7 is a plan view for showing a second embodiment of the tunable laser according to the present invention.

FIG. 7 is a plan view for showing a second embodiment of the tunable laser according to the present invention. Description will be provided hereinafter by referring to the drawing, however, the same reference numerals are applied to the same components as those of FIG. 1 and the description thereof will be omitted.

A tunable laser 30 of the embodiment is provided with light-receiving elements 22p and 23p. The light-receiving element 22p detects the light passing through a thru port 26t of a directional coupler 26 that couples the ring resonant element 22 and a waveguide 29. The light-receiving element 23p detects the light passing through a thru port 13t of a directional coupler 13 that couples the ring resonant element 23 and a reflection-side waveguide 14. At this time, a control device (corresponds to the control device 18 shown in FIG. 5) controls: the amount of current flown to the phase control region 171 of the SOA 17 such that the photocurrent obtained by the light-receiving element 21p becomes the minimum; the amount of current flown to the film heater 22h such that the photocurrent obtained by the light-receiving element 22p becomes the minimum; and the amount of current flown to the film heater 23h such that the photocurrent obtained by the light-receiving element 23p becomes the minimum. As a result, fluctuation of the resonant wavelength by the three ring resonant elements 21-23 can be suppressed, thereby achieving a stable state.

Further, the control device finds a difference in the power supply from the initial state based on the flown current amounts and stores the values thereof in a register as the phase control amounts so as to use them as the phase correction amounts for the next tuning of the wavelengths. The embodiment allows wavelength control with still higher precision by separately performing feedback control on the three ring resonant elements 21-23.

As described above, the embodiment is distinctive in respect that the light-receiving elements 21p, 22p, 23p are mounted to the thru ports 11t, 26t, 13t of each of the ring resonant elements 21, 22, 23. The wavelength dissociation amount from the ITU grid is detected by using the light-receiving element 21p. The light-receiving elements 22p and 23p are for detecting the states of the ring resonant elements 22 and 23. In the tunable laser 30, the light traveling back and force within the ring resonant elements 21-23 can be concentrated to the drop port by controlling the light output from each of the thru ports 11t, 26t, 13t to be the minimum. Therefore, it is possible to achieve a stable action with no mode jump. Through performing such control, it is possible to achieve a long-term stability that meets the actual specification.

Third Embodiment

Figure 8:
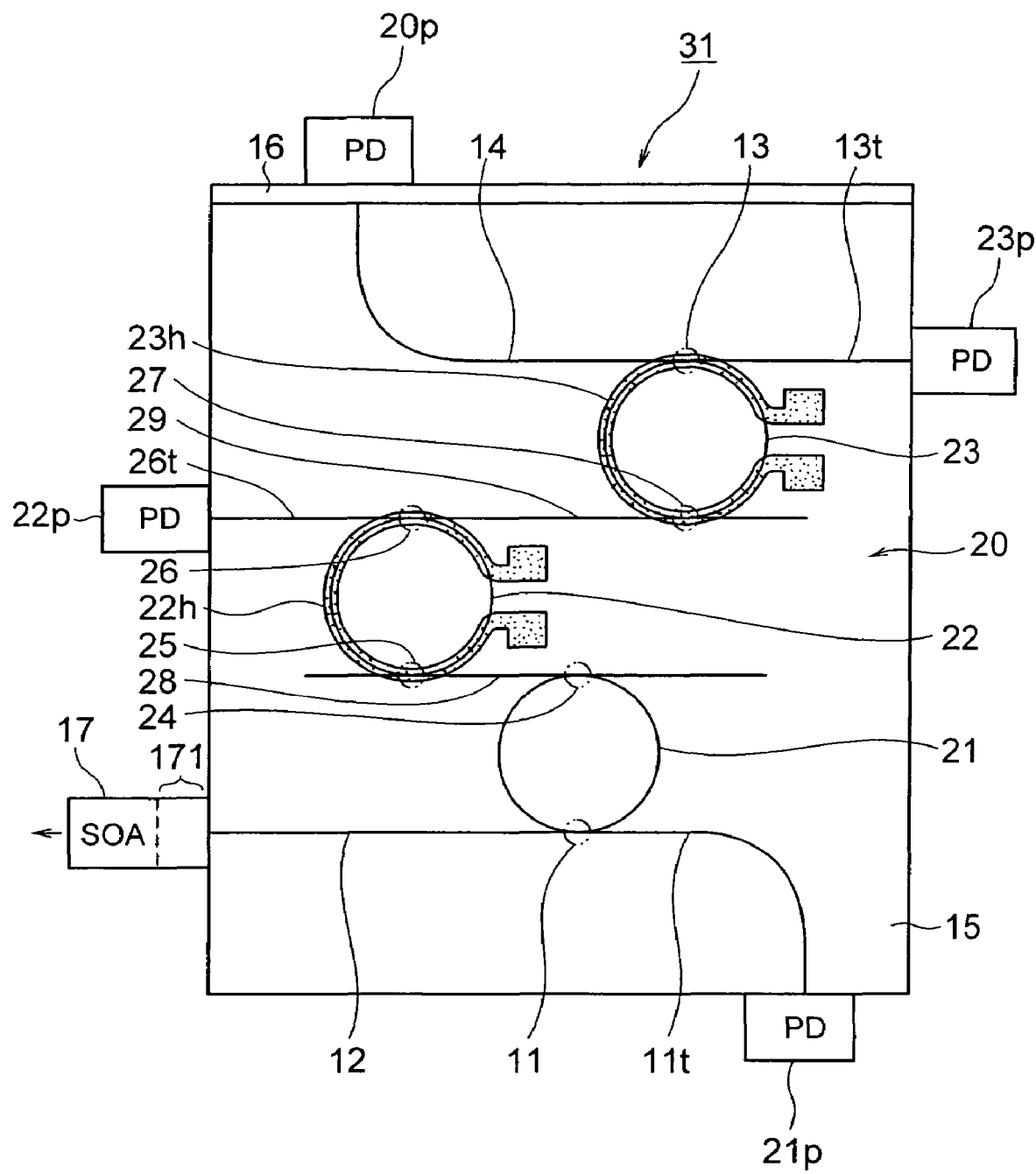
FIG. 8 is a plan view for showing a third embodiment of the tunable laser according to the present invention.
Figure 9:
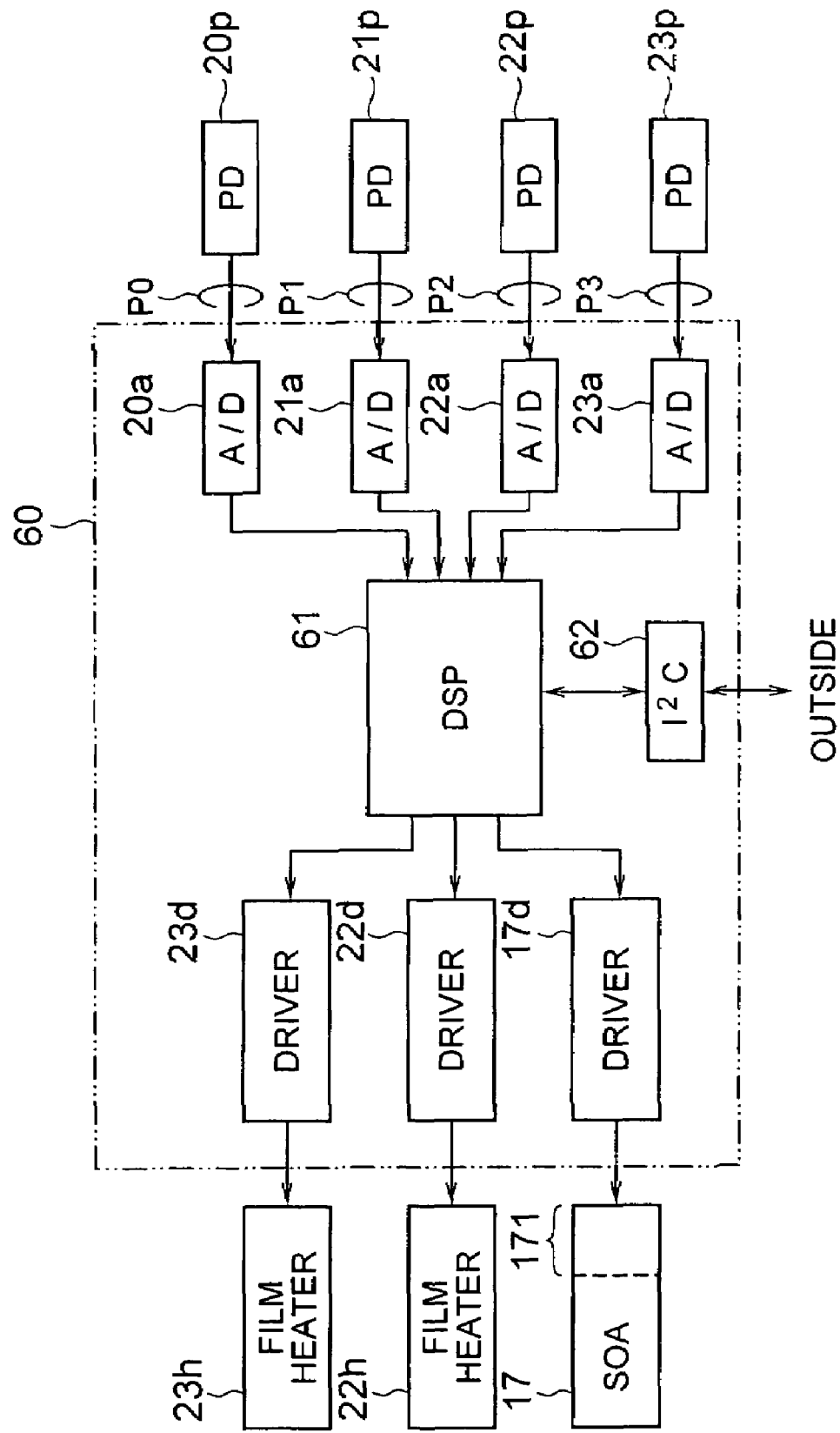
FIG. 9 is a block diagram for showing an example of a control device according to a third embodiment.

FIG. 8 is a plan view for showing a third embodiment of the tunable laser according to the present invention. FIG. 9 is a block diagram for showing an example of the control device according to the third embodiment. Description will be provided hereinafter by referring to the drawing. However, in FIG. 8, the same reference numerals are applied to the same components as those of FIG. 7 and the description thereof will be omitted.

A tunable laser 31 of the embodiment is provided with a light-receiving element 20p. The light-receiving element 20p detects a small amount of light that transmits through a high reflection film 16. A control device 60 comprises, around a DSP 61, A/D converters 20a, 21a, 22a, 23a, drivers 23d, 22d, 17d, and an external interface circuit 62, etc. The A/D converters 20a, - - - convert an analog signal outputted from the light-receiving elements 20p, - - - to a digital signal and outputs it to the DSP 61. The drivers 23d, - - - is constituted with transistors and the like for outputting DC voltage, for example, and supply the electric power to the film heaters 23h, 22h and the SOA 17 in accordance with a control signal from the DSP 61. The external interface circuit 62 is I²C (inter-integrated circuit), i.e. interface specification between chips, for example, which associates with input/output of the signals between the DSP 61 and external computers and the like.

When the photocurrent values obtained in the light-receiving elements 20p-23p are P0-P3, the control device 60 divides P1-P3 by P0 to have P1/P0, P2/P0, and P3/P0. That is, the photocurrent values P1-P3 are normalized by the photocurrent value P0, thereby receiving no influence by fluctuation of the photocurrent value P0. It is preferable for the reflectance of the high reflection film 16 to be about 90% for improving the detection sensitivity of the light-receiving element 20p. The embodiment allows the wavelength control with still higher precision by normalizing the photocurrent values of each of the light-receiving elements 21p-23p.

Fourth Embodiment

Figure 10:
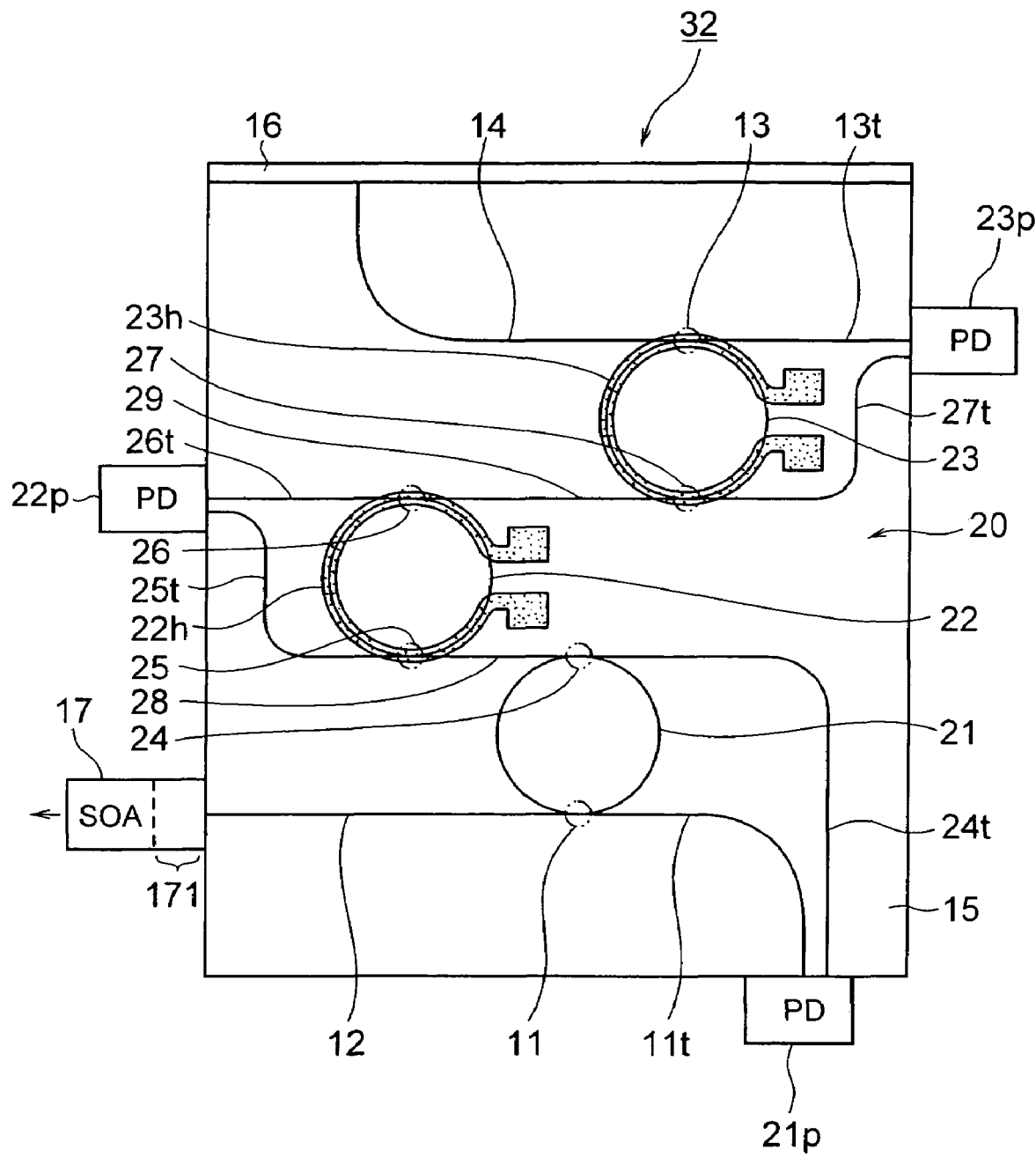
FIG. 10 is a plan view for showing a fourth embodiment of the tunable laser according to the present invention.

FIG. 10 is a plan view for showing a fourth embodiment of the tunable laser according to the present invention. Description will be provided hereinafter by referring to the drawing, however, the same reference numerals are applied to the same components as those of FIG. 7 and the description thereof will be omitted.

A tunable laser 32 of the embodiment is structured to guide the light to all the light-receiving elements 21p-23p from two thru ports. Specifically, the light-receiving element 21p detects the sum of the light passing through the trough port 11t of the directional coupler 11 that couples the ring resonant element 21 and the input/output-side waveguide 12 and the light passing through the thru port 24t of the directional coupler 24 that couples the ring resonant element 21 and the waveguide 28. The light-receiving element 22p detects the sum of the light passing through the thru port 26t of the directional coupler 26 that couples the ring resonant element 22 and the waveguide 29 and the light passing through the thru port 25t of the directional coupler 25 that couples the ring resonant element 22 and the waveguide 24. The light-receiving element 23p detects the sum of the light passing through the thru port 13t of the directional coupler 13 that couples the ring resonant element 23 and the reflection-side waveguide 14 and the light passing through the thru port 27t of the directional coupler 27 that couples the ring resonant element 23 and the waveguide 29. The embodiment allows an improvement in the detection sensitivity of each of the light-receiving elements 21p-23p, thereby achieving the wavelength control with still higher precision. It may also be so constituted that only one or two of the light receiving elements 21p-23p receive the light guided from the two thru ports.

Fifth and Sixth Embodiments

Figure 11:
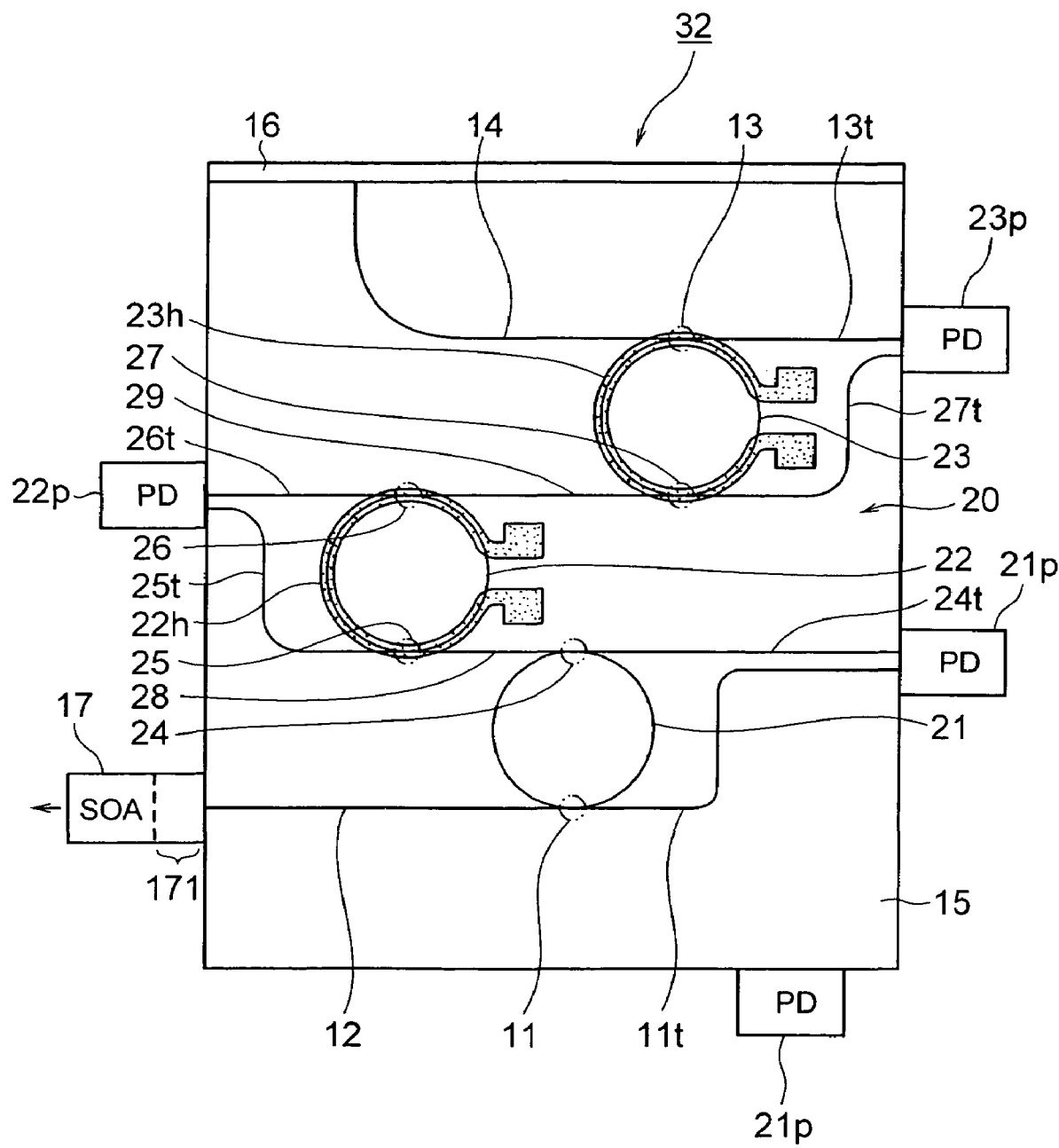
FIG. 11 is a plan view for showing a fifth embodiment of the tunable laser according to the present invention.
Figure 12:
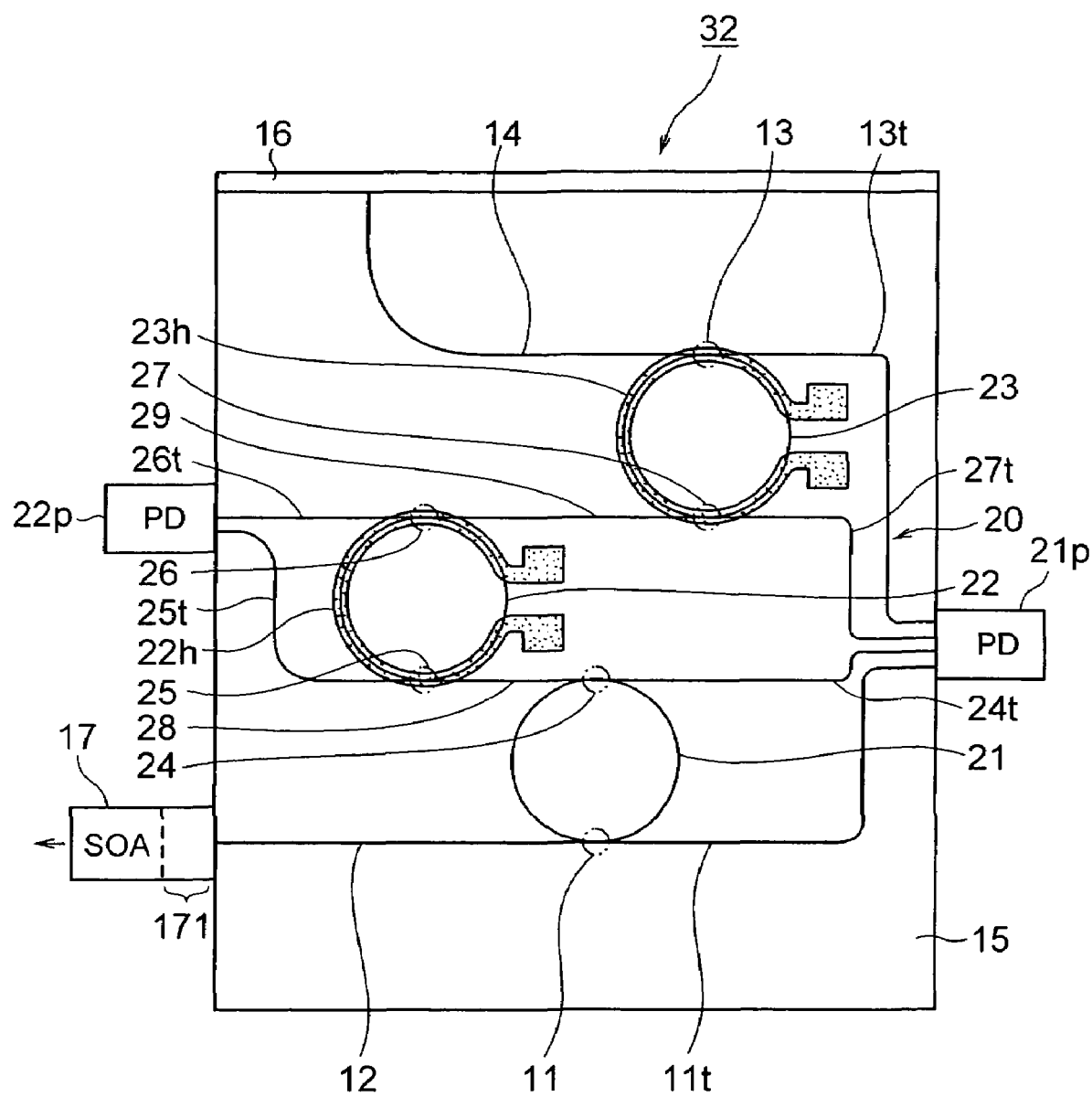
FIG. 12 is a plan view for showing a sixth embodiment of the tunable laser according to the present invention.

Further, as shown in FIG. 11 as a fifth embodiment, it may be so constituted that the light-receiving elements 21p and 23p are gathered on one side of the PLC substrate 15. In this case, it becomes easy to mount the light-receiving elements. Furthermore, as shown in FIG. 12 as a sixth embodiment, it may be so constituted that the sum of the light passing through the thru ports 11t, 24t, 13t, and 27t is detected by the light-receiving element 21p alone. In this case, the number of components for the light-receiving elements can be reduced.

Seventh Embodiment

Figure 13:
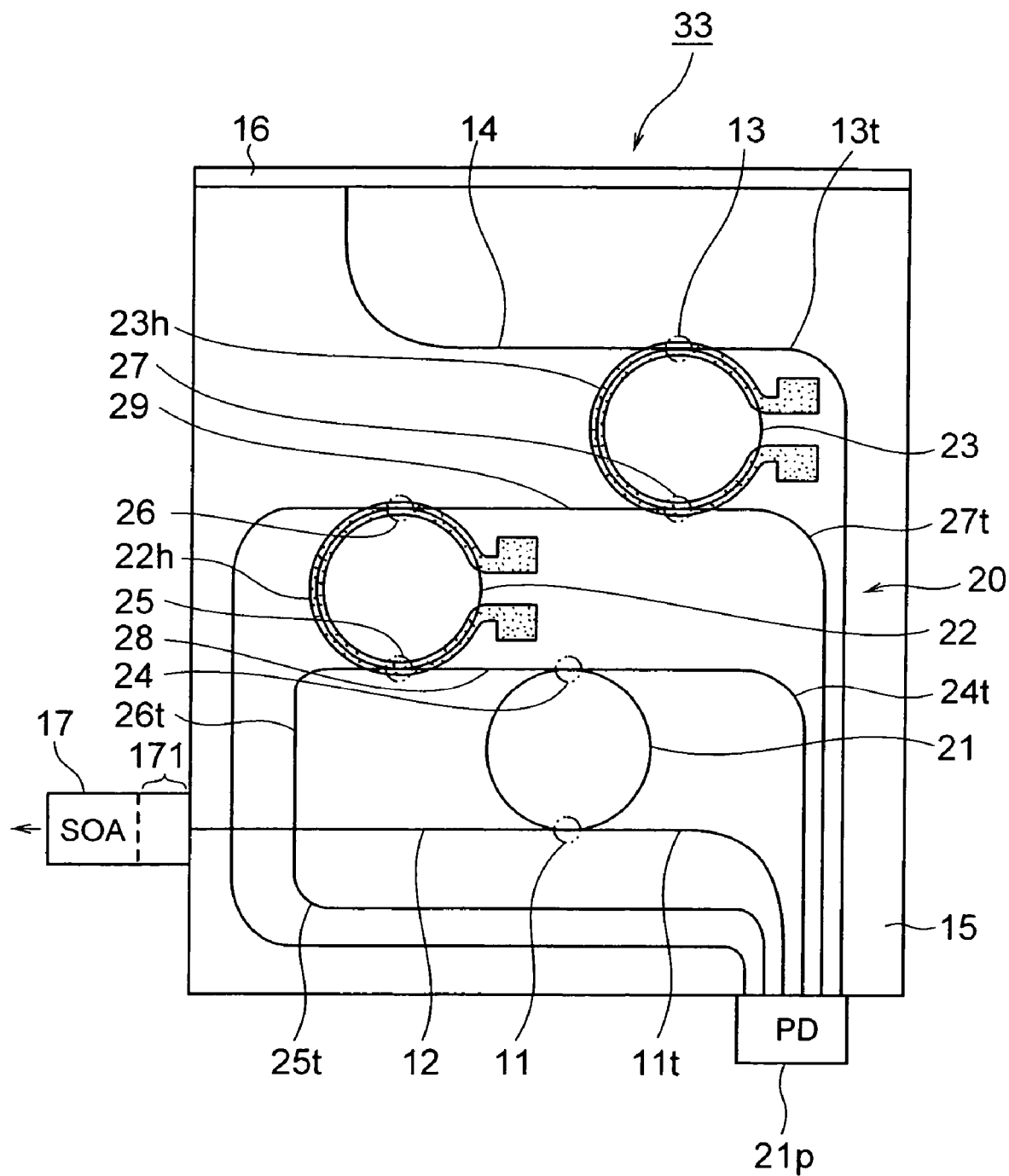
FIG. 13 is a plan view for showing a seventh embodiment of the tunable laser according to the present invention.

FIG. 13 is a plan view for showing a seventh embodiment of the tunable laser according to the present invention. Description will be provided hereinafter by referring to the drawing, however, the same reference numerals are applied to the same components as those of FIG. 7 and the description thereof will be omitted.

Figure 14:
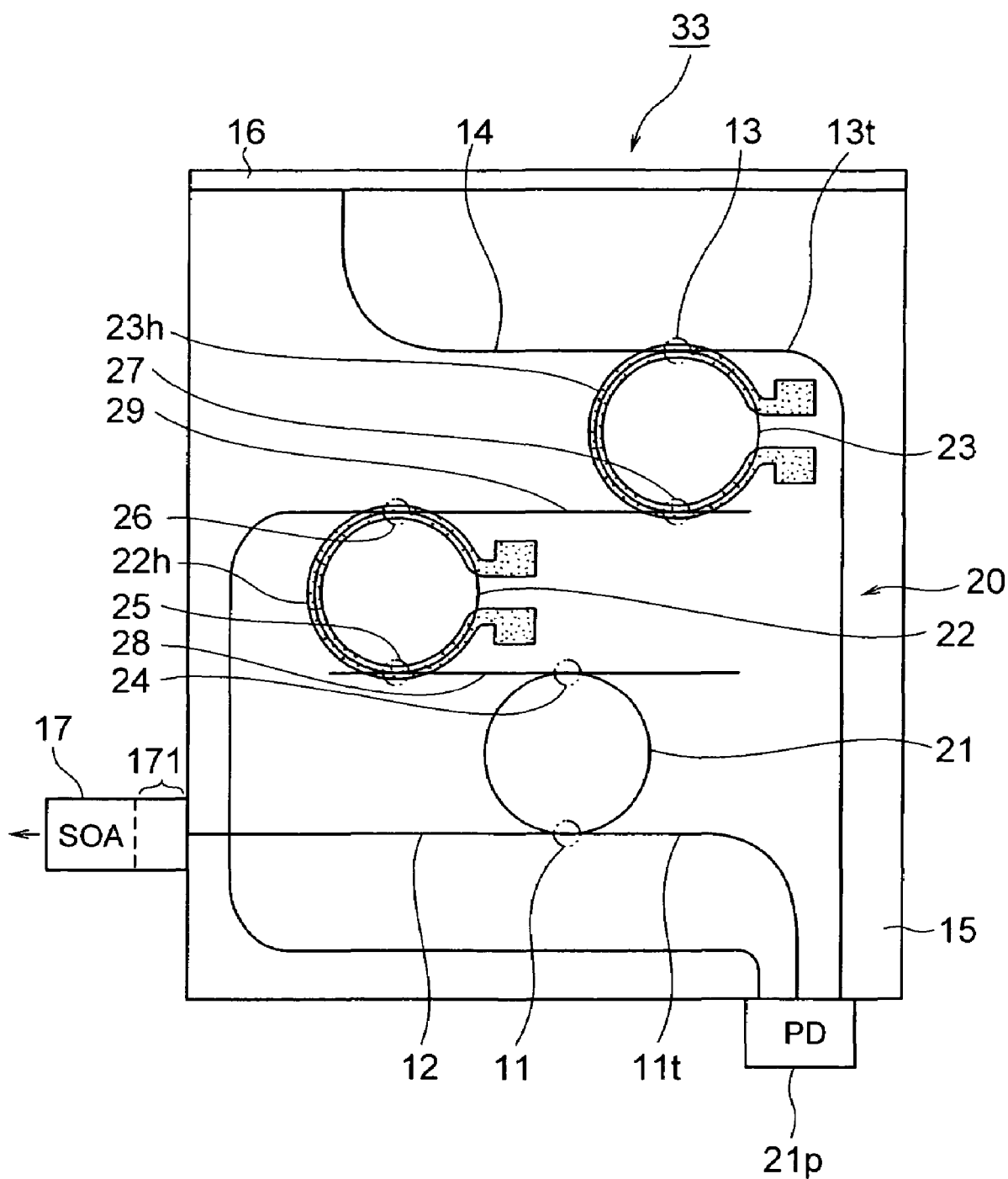
FIG. 14 is a plan view for showing an eighth embodiment of the tunable laser according to the present invention.

A tunable laser 33 of the embodiment is structured to guide the light to the light-receiving element 21p from all the thru ports. Specifically, the light-receiving element 21p detects the sum of: the light passing through the thru port 11t of the directional coupler 11 that couples the ring resonant element 21 and the input/output-side waveguide 12; the light passing through the thru port 24t of the directional coupler 24 that couples the ring resonant element 21 and the waveguide 28; the light passing through the thru port 26t of the directional coupler 26 that couples the ring resonant element 22 and the waveguide 29; the light passing through the thru port 25t of the directional coupler 25 that couples the ring resonant element 22 and the waveguide 24; the light passing through the thru port 13t of the directional coupler 13 that couples the ring resonant element 23 and the reflection-side waveguide 14; and the light passing through the thru port 27t of the directional coupler 27 that couples the ring resonant element 23 and the waveguide 29. With the embodiment, the detection sensitivity of the light-receiving element 21p is improved, so that the wavelength control with still higher precision can be achieved. It may also be so constituted that the light is guided from two or more of any thru ports to the light-receiving element 21p as shown in FIG. 14 as an eighth embodiment.

Eighth Embodiment

Figure 15A:
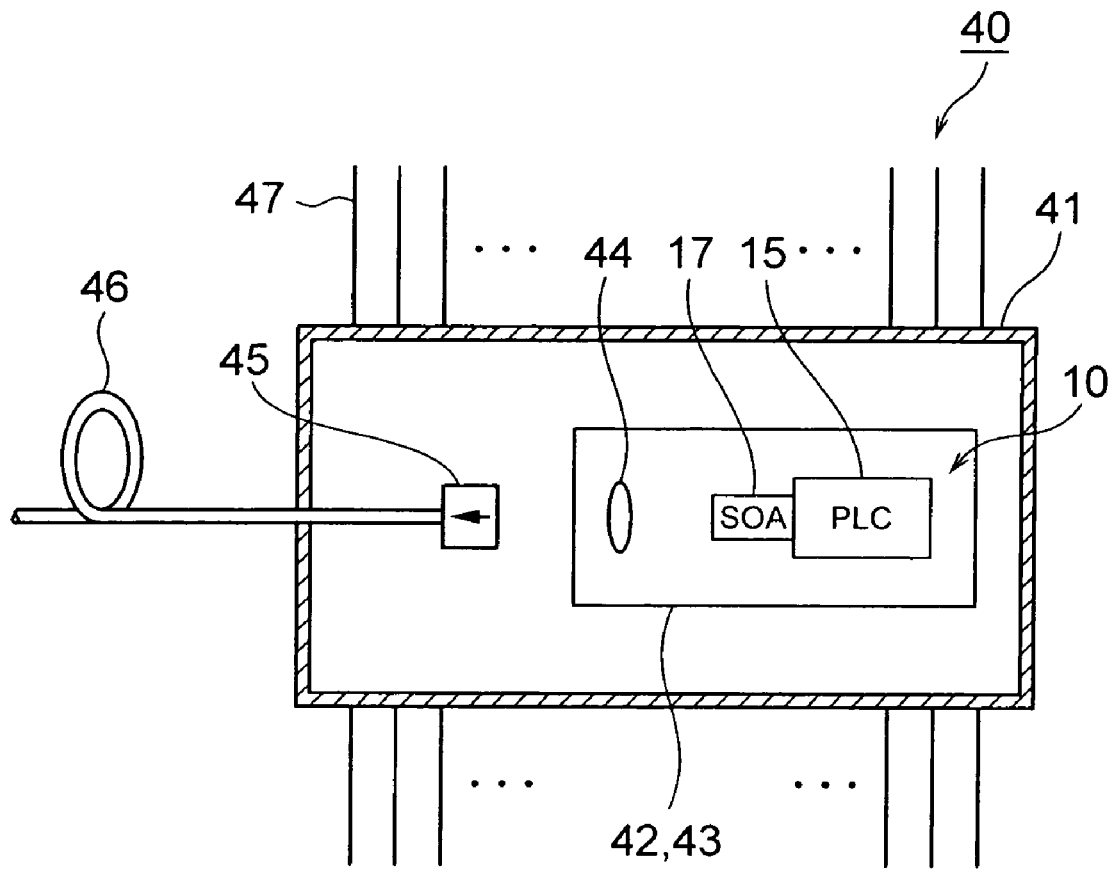
FIG. 15A is a plan view and FIG. 15B is a fragmentary side view.
Figure 15B:
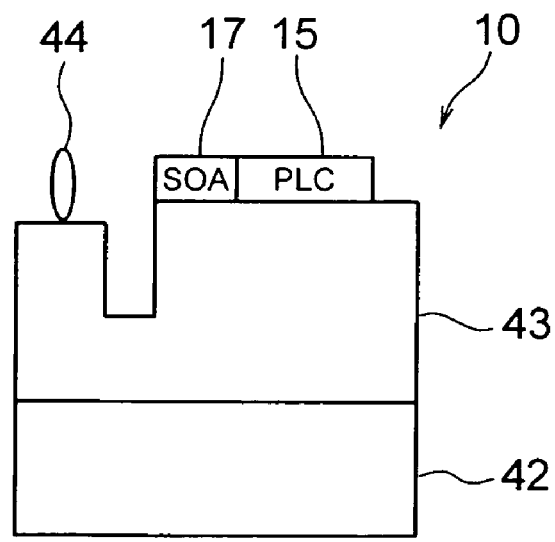

FIG. 15 shows an embodiment of an optical module that uses the tunable laser according to the above-described embodiments of the present invention. FIG. 15A is a plane view and FIG. 15B is a fragmentary side view. Description will be provided hereinafter by referring to the drawings, however, the same reference numerals are applied to the same components as those of FIG. 1 and the description thereof will be omitted.

An optical module 40 of the embodiment has the tunable laser 10 of FIG. 1 housed in a case 41. The tunable laser 10 is illustrated schematically. In addition to the tunable laser 10 constituted with the SOA 17, the PLC substrate 15 and the like, there are provided a pedestal 43, a micro-lens 44, a light isolator 45 and the like within the case 41. An optical fiber 46 is provided from the inside the case 41 towards outside. Outside the case 41, there are provided pins 47 that are electrically connected to a Peltier element 42, the SOA 17, the PLC substrate 15 and the like. The pedestal 43 is made of CuW, which is provided on the Peltier element 42. The SOA 17, the PLC substrate 15, the micro-lens 44 and the like are provided on the pedestal 43.

Next, action of the optical module 40 will be described. First, a control signal and electric power are supplied from a control device (not shown) to the tunable laser 10 and the Peltier element 42 through the pins 47. With this, the above-described tuning control is executed and the light with a desired wavelength is outputted in order from the SOA 17, the micro-lens 44, the light isolator 45, to the optical fiber 46.

With the embodiment, the whole effect of the tunable laser 10 as described above can be achieved as it is. In addition, since the SOA 17 and the PLC substrate 15 are directly coupled (butt coupling), there require only a small number of components, so that it is advantageous for downsizing.

Ninth Embodiment

Figure 16A:
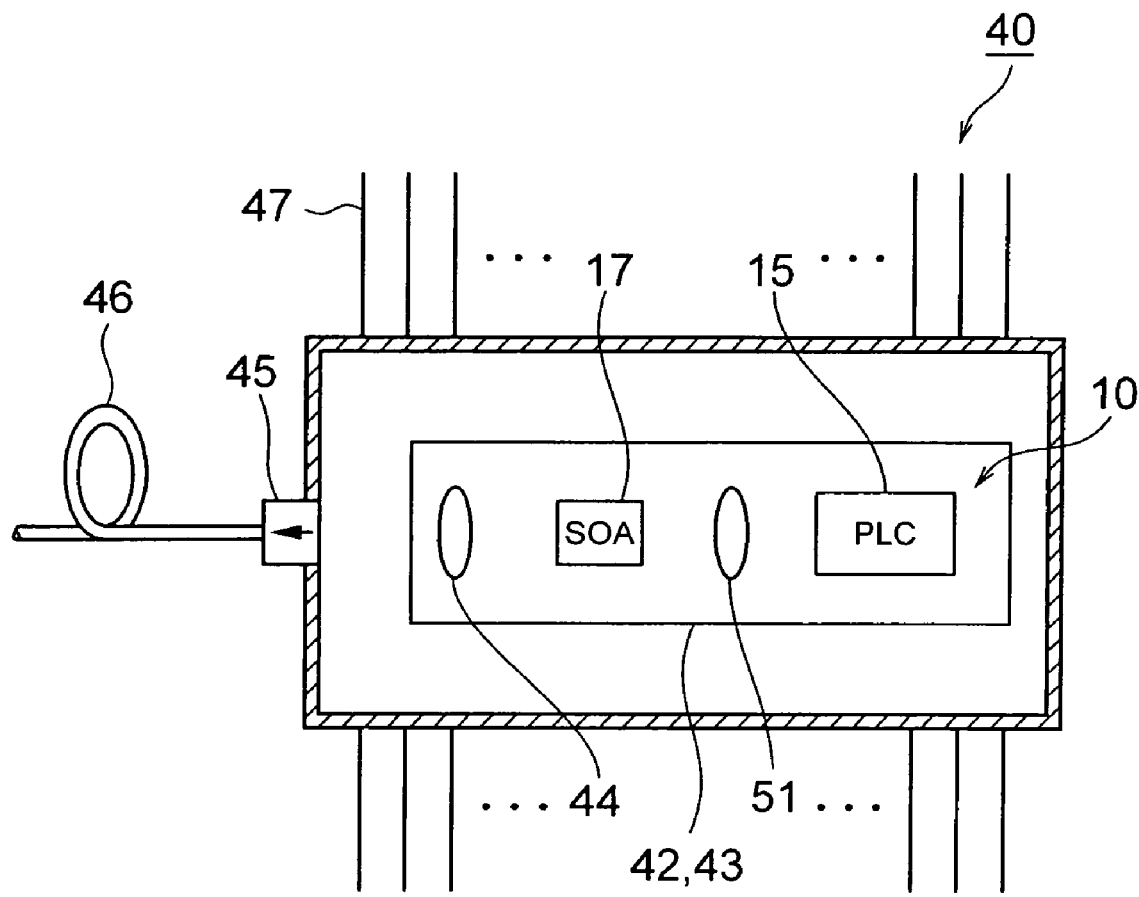
FIG. 16A is a plan view and FIG. 16B is a fragmentary side view.
Figure 16B:
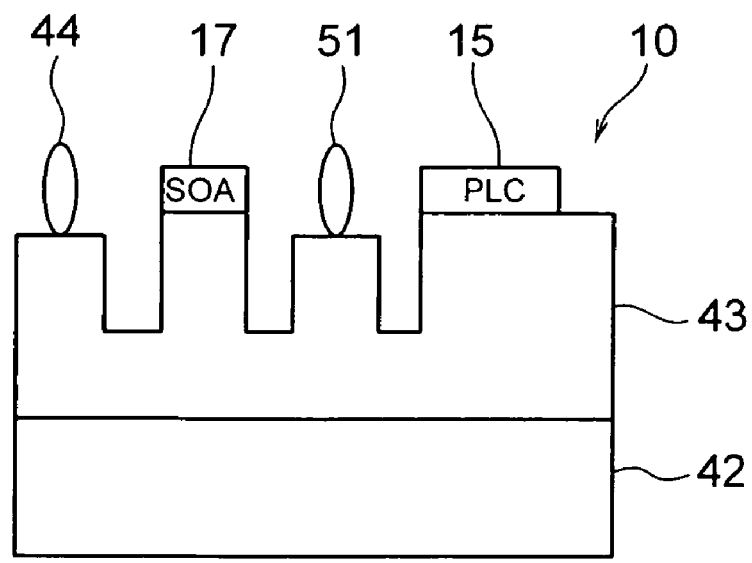

FIG. 16 shows another embodiment of an optical module that uses the tunable laser according to the above-described embodiments of the present invention. FIG. 16A is a plane view and FIG. 16B is a fragmentary side view. Description will be provided hereinafter by referring to the drawings, however, the same reference numerals are applied to the same components as those of FIG. 15 and the description thereof will be omitted.

The SOA 17 and the PLC substrate 15 are directly coupled in the embodiment shown in FIG. 15A and FIG. 15B, whereas the SOA 17 and the PLC substrate 15 are coupled through a micro-lens 51 in an optical module 50 according to the embodiment shown in FIG. 16A and FIG. 16B. This structure has such advantage that the SOA 17 and the PLC substrate 15 can be coupled with still smaller loss. Other structures and the effects thereof are almost the same as those of the above-described embodiments.

Needless to say, the present invention is not limited to each of the above-described embodiments. For example, the multiple ring resonator is not limited to be formed with three ring resonant elements but may be structured by coupling two, or four or more of ring resonant elements. Further, each of the ring resonant elements may be directly coupled to each other by using only the directional coupler. Furthermore, the present invention can be applied not only to the ring resonators but also to resonators that can be formed with optical waveguides. For example, it may be structured with Mach-Zehnder interferometers connected in multiple steps.

As described above, the present invention allows a large tunable amount with a small amount of operation even though it is in a simple structure where the resonant wavelength is detected from the thru port of the multiple ring resonator, and the resonant wavelength of the multiple ring resonator is changed based on the result. Therefore, it is possible with the present invention to provide a low-price, high-performance, and highly reliable tunable laser, which has not been achieved conventionally.

What is claimed is:

1. A tunable laser, comprising:
   a multiple resonator in which a plurality of resonant elements having different optical path lengths from each other are combined;
   a light reflecting device for returning, to the multiple resonator, an optical signal emitted from the multiple resonator;
   a tunable device for changing a resonant wavelength of the multiple resonator;
   a photo detecting device for detecting the optical signal in a thru port of a resonant element included in the multiple resonator; and
   a control device for controlling the tunable device in accordance with the optical signal detected by the photo detecting device.

2. The tunable laser according to claim 1, wherein the multiple resonator comprises a light input/output device which transmits the optical signal to the multiple resonator and outputs the optical signal outputted from the multiple resonator outside.

3. The tunable laser according to claim 1, wherein
   the multiple resonator has a structure in which a plurality of ring resonant elements with ring waveguides having different optical path length from each other are combined, and
   the multiple resonator is formed on a substrate.

4. The tunable laser according to claim 2, wherein a semiconductor optical amplifier is used as the light input/output device.

5. The tunable laser according to claim 1, wherein
   a film heater, which is provided on a substrate where the multiple resonator is formed, is used as the tunable device, and
   the film heater has a function of changing the resonant wavelength by changing the optical path length through varying waveguide lengths of the resonant elements and waveguide refractive index by heat.

6. The tunable laser according to claim 1, wherein a light-receiving element is used as the tunable device.

7. The tunable laser according to claim 6, wherein the light-receiving element detects the optical signal in the thru port of at least one resonant element among the plurality of resonant elements.

8. The tunable laser according to claim 5, comprising a thermoregulation device for keeping the substrate at a constant temperature.

9. An optical module, comprising:
   a tunable laser as a light source;
   a thermoregulation device for keeping the tunable laser at a constant temperature;
   a case for housing the thermoregulation device and the tunable laser;
   an electric conductive device which supplies electric power to the tunable laser and the thermoregulation device from outside the case, and inputs/outputs an electric signal; and
   a photoconductive device for guiding light emitted from the tunable laser outside the case,
   wherein the tunable laser comprises:
      a multiple resonator in which a plurality of resonant elements having different optical path lengths from each other are combined;
      a light reflecting device for returning, to the multiple resonator, an optical signal emitted from the multiple resonator;
      a tunable device for changing a resonant wavelength of the multiple resonator;
      a photo detecting device for detecting the optical signal in a thru port of a resonant element included in the multiple resonator; and
      a control device for controlling the tunable device in accordance with the optical signal detected by the photo detecting device.

* * * * *